United States Patent
Nitta et al.

(10) Patent No.: US 11,371,165 B2
(45) Date of Patent: Jun. 28, 2022

(54) VAPOR PHASE EPITAXIAL GROWTH DEVICE

(71) Applicant: NATIONAL UNIVERSITY CORPORATION TOKAI NATIONAL HIGHER EDUCATION AND RESEARCH SYSTEM, Nagoya (JP)

(72) Inventors: Shugo Nitta, Nagoya (JP); Naoki Fujimoto, Nagoya (JP); Hiroshi Amano, Nagoya (JP); Yoshio Honda, Nagoya (JP)

(73) Assignee: NATIONAL UNIVERSITY CORPORATION TOKAI NATIONAL HIGHER EDUCATION AND RESEARCH SYSTEM, Nagoya (JP)

( * ) Notice: Subject to any disclaimer, the term of this patent is extended or adjusted under 35 U.S.C. 154(b) by 0 days.

(21) Appl. No.: 17/265,017

(22) PCT Filed: Dec. 19, 2019

(86) PCT No.: PCT/JP2019/049835
§ 371 (c)(1),
(2) Date: Feb. 1, 2021

(87) PCT Pub. No.: WO2020/137804
PCT Pub. Date: Jul. 2, 2020

(65) Prior Publication Data
US 2021/0310154 A1    Oct. 7, 2021

(30) Foreign Application Priority Data
Dec. 26, 2018   (JP) .............................. JP2018-243434

(51) Int. Cl.
*C30B 35/00*    (2006.01)
*C30B 29/40*    (2006.01)
(Continued)

(52) U.S. Cl.
CPC ............ *C30B 29/406* (2013.01); *C23C 16/34* (2013.01); *C23C 16/448* (2013.01); *C30B 25/10* (2013.01);
(Continued)

(58) Field of Classification Search
CPC ......... C30B 25/00; C30B 25/02; C30B 25/10; C30B 25/14; C30B 25/16; C30B 25/165;
(Continued)

(56) References Cited

U.S. PATENT DOCUMENTS

2004/0026704 A1* 2/2004 Nikolaev ............ H01L 31/0304
257/82
2008/0083910 A1* 4/2008 Scholz .................. C30B 25/165
252/521.5
(Continued)

FOREIGN PATENT DOCUMENTS

JP     2002-316892 A    10/2002
JP     2010500267 A     1/2010

OTHER PUBLICATIONS

Written Opinion of the International Searching Authority and English translation for corresponding application No. PCT/JP2019/049835 dated Mar. 17, 2020.
(Continued)

*Primary Examiner* — Kenneth A Bratland, Jr.
(74) *Attorney, Agent, or Firm* — Miles & Stockbridge P.C.

(57) ABSTRACT

A vapor phase epitaxial growth device comprises a reactor vessel. The device comprises a wafer holder arranged in the reactor vessel. The device comprises a first material gas
(Continued)

supply pipe configured to supply first material gas to the reactor vessel. The device comprises a second material gas supply pipe configured to supply second material gas, which is to react with the first material gas, to the reactor vessel. The device comprises a particular gas supply pipe having a solid unit arranged on a supply passage. The device comprises a first heater unit configured to heat the solid unit to a predetermined temperature or higher. The solid unit comprises a mother region and a first region arranged continuously within the mother region. The mother region is a region that does not decompose at the predetermined temperature. The first region is a region that decomposes at the predetermined temperature and contains Mg.

16 Claims, 13 Drawing Sheets

(51) Int. Cl.

| | | |
|---|---|---|
| *C23C 16/34* | (2006.01) | |
| *C23C 16/448* | (2006.01) | |
| *C30B 25/10* | (2006.01) | |
| *C30B 25/14* | (2006.01) | |
| *H01L 21/02* | (2006.01) | |
| *H01L 21/205* | (2006.01) | |

(52) U.S. Cl.
CPC .......... *C30B 25/14* (2013.01); *H01L 21/0262* (2013.01); *H01L 21/205* (2013.01)

(58) Field of Classification Search
CPC .......... C30B 29/00; C30B 29/10; C30B 29/40; C30B 29/403; C30B 29/406; C30B 35/00; C30B 35/007; C23C 16/30; C23C 16/301; C23C 16/303; C23C 16/34; C23C 16/448; C23C 16/4481; C23C 16/4483; H01L 21/0262; H01L 21/205
USPC ........ 117/2, 84, 88, 102, 200, 204, 937, 952
See application file for complete search history.

(56) References Cited

U.S. PATENT DOCUMENTS

2012/0235116 A1   9/2012   Su et al.
2014/0151716 A1   6/2014   Scholz et al.

OTHER PUBLICATIONS

International Search Report (ISR) and English translation for corresponding application No. PCT/JP2019/049835 dated Mar. 17, 2020.

* cited by examiner

⊢ 2.5 μm ⊣

⊢ 300nm ⊣

2.5 μm 2.5 μm

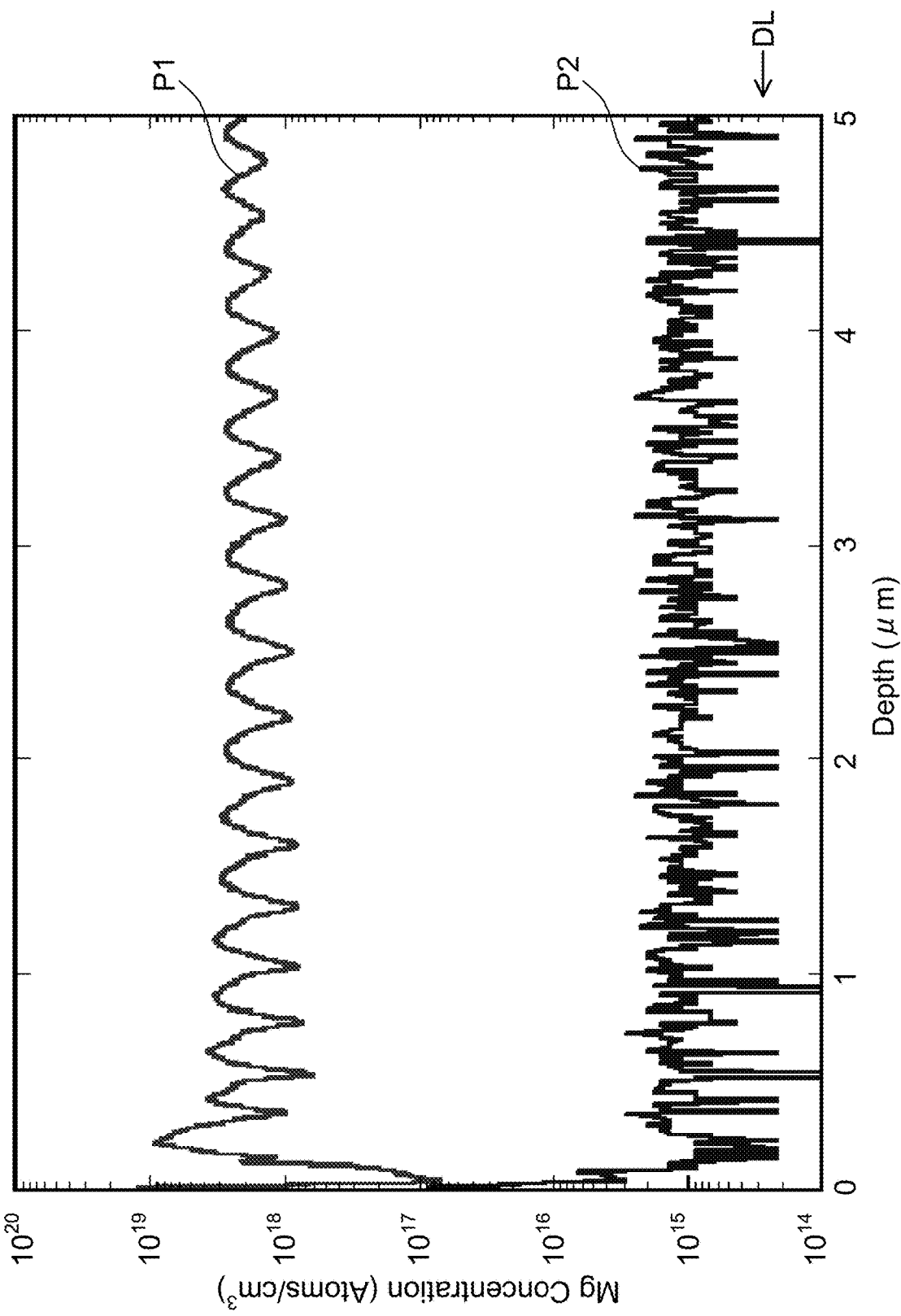

VAPOR PHASE EPITAXIAL GROWTH DEVICE

CROSS-REFERENCE TO RELATED APPLICATIONS AND TECHNICAL FIELD

This application is a national stage filing under 35 U.S.C. § 371 of PCT/JP2019/049835, filed on Dec. 19, 2019, the contents of which are hereby incorporated by reference into the present application. This application claims priority to Japanese Patent Application No. 2018-243434, filed on Dec. 26, 2018, the contents of which are hereby incorporated by reference into the present application. The description herein discloses an art related to a vapor phase epitaxial growth device of a compound semiconductor.

BACKGROUND ART

Vapor phase epitaxial growth methods that do not use organic metal such as a HVPE (Halide Vapor Phase Epitaxy) method and vapor phase epitaxial growth methods using Ga vapor as a raw material are known. In these vapor phase epitaxial growth methods, carbon contamination does not occur in grown crystals. A technique related therewith is described in JP 2002-316892 A.

SUMMARY OF INVENTION

Technical Problem

In the vapor phase epitaxial growth methods that do not use organic metal such as the HVPE method, it is difficult to dope Mg, which is considered to be a most useful p-type acceptor. This is because it is difficult to control a supply amount thereof to be constant, due to reasons such as when organic metal such as $Cp_2Mg$ is used, it is decomposed before reaction occurs, and when doping is to be carried out using metal Mg, Mg evaporates excessively.

Technical Solution

The present description discloses a vapor phase epitaxial growth device for a compound semiconductor. The device comprises a reactor vessel. The device comprises a wafer holder arranged in the reactor vessel. The device comprises a first material gas supply pipe configured to supply first material gas to the reactor vessel. The device comprises a second material gas supply pipe configured to supply second material gas, which is to react with the first material gas, to the reactor vessel. The device comprises a particular gas supply pipe having a solid unit arranged on a supply passage. The device comprises a first heater unit configured to heat the solid unit to a predetermined temperature or higher. The solid unit comprises a mother region and a first region arranged continuously within the mother region. The mother region is a region that does not decompose at the predetermined temperature. The first region is a region that decomposes at the predetermined temperature and contains Mg.

In the vapor phase epitaxial growth device described herein, the solid unit is heated to the predetermined temperature or higher by the first heater unit. The first region in the solid unit thereby decomposes, and a gas containing Mg is thereby supplied into the reactor vessel. Further, the first region is arranged continuously within the mother region. As such, a continuous void is formed after the first region has decomposed. Mg can be supplied from the first region on a deeper inner side of the solid unit with this continuous void as a supply passage. Due to this, a constant amount of Mg can be supplied from the solid unit. As compared to a case of using Mg metal, a supply amount of Mg can be controlled to be constant.

The first region may further contain alkaline earth metal other than Mg.

The first region may further contain at least one of aluminum oxide, boron oxide, silicon oxide, yttrium oxide, aluminum nitride, silicon nitride, or boron nitride.

At least one of the first material gas supply pipe or the second material gas supply pipe may be used as the particular gas supply pipe.

The solid unit may be arranged in at least one of a vicinity of a first gas supply inlet configured to supply the first material gas to a vicinity of the wafer holder or a vicinity of a second gas supply inlet configured to supply the second material gas to a vicinity of the wafer holder.

The device may further comprise a shower head having a plurality of the first gas supply inlets and a plurality of the second gas supply inlets. At least a part of the shower head may be configured by the solid unit.

The solid unit may be arranged on at least one of a passage of the first material gas supply pipe or a passage of the second material gas supply pipe.

The solid unit may be a ceramic sintered body or high melting-point metal. The mother region may be an inorganic compound. The first region may be a substance obtained by firing a binder mixed in the inorganic compound for molding the inorganic compound prior to sintering the same.

The first material gas may be gas containing Ga. The second material gas may be gas containing $NH_3$.

At least one of inert gas such as $N_2$, Ar, He, Xe, and Kr or gas such as $H_2$ may be supplied to at least one of the first material gas supply pipe or the second material gas supply pipe as carrier gas.

BRIEF DESCRIPTION OF DRAWINGS

FIG. 18 shows SIMS measurement results of a Mg content in a GaN crystal.

DESCRIPTION OF EMBODIMENTS

First Embodiment

<Configuration of Vapor Phase Epitaxial Growth Device>

Figure 1:
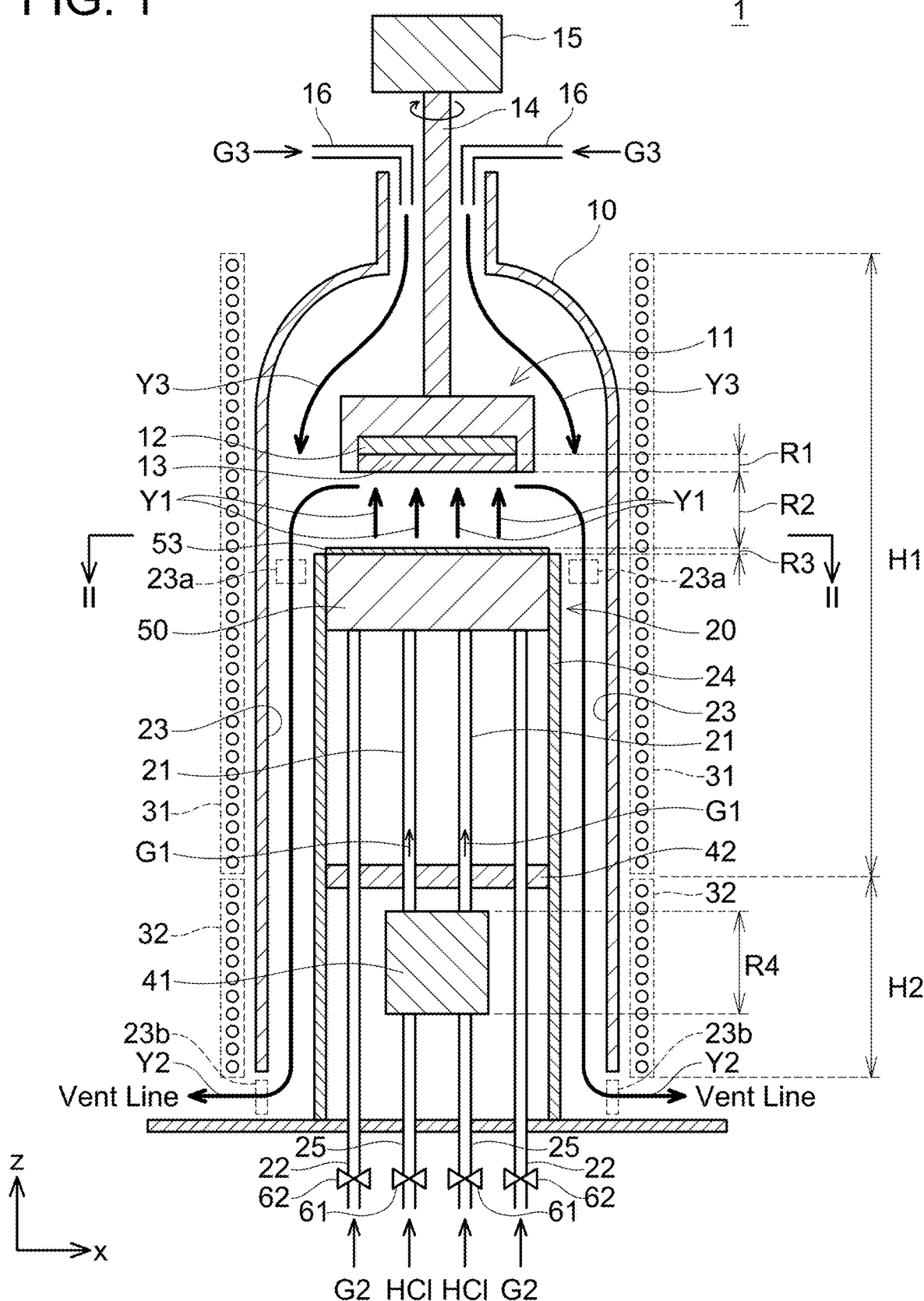
FIG. 1 is a schematic cross-sectional view seeing a vapor phase epitaxial growth device of a first embodiment along a lateral direction.

FIG. 1 shows a schematic cross-sectional view seeing a vapor phase epitaxial growth device 1 according to an aspect of the art disclosed herein along a lateral direction. The vapor phase epitaxial growth device 1 is an example of a device configuration for implementing a HVPE (Halide Vapor Phase Epitaxy) method. The vapor phase epitaxial growth device 1 is provided with a reactor vessel 10. The reactor vessel 10 has a cylindrical shape. The reactor vessel 10 may be constituted of quartz. A material gas supply unit 20 and a wafer holder 11 are arranged within the reactor vessel 10.

A structure of the material gas supply unit 20 will be described. The material gas supply unit 20 is a cylindrical member. The material gas supply unit 20 is provided with a cylindrical cover 24. A disk-shaped shower head 50 is arranged at an upper end of the cover 24. Inlets of HCl gas supply pipes 25 and inlets of second material gas supply pipes 22 are arranged at a lower portion of the material gas supply unit 20. A first valve 61 is arranged at each of the inlets of the HCl gas supply pipes 25. The first valves 61 are each configured to control supply of a gas containing HCl. Outlets of the HCl gas supply pipes 25 are connected to a first material gas generation unit 41. The first material gas generation unit 41 accommodates metal gallium therein. The first material gas generation unit 41 is a unit configured to generate a first material gas G1 containing GaCl. First material gas supply pipes 21 are pipes configured to supply the first material gas G1. Inlets of the first material gas supply pipes 21 are connected to the first material gas generation unit 41. Outlets of the first material gas supply pipes 21 are connected to the shower head 50. A second valve 62 is arranged at each of inlets of the second material gas supply pipes 22. The second valves 62 are each configured to control supply of a gas containing second material gas G2. The second material gas G2 is a gas containing $NH_3$. Outlets of the second material gas supply pipes 22 are connected to the shower head 50. An inert gas such as $N_2$, Ar, He, Xe, and Kr and a gas such as $H_2$ may be used as a carrier gas in the first material gas supply pipes 21 and the second material gas supply pipes 22.

The first material gas supply pipes 21 and the second material gas supply pipes 22 are arranged to extend in a vertical direction (i.e., a z-axis direction of FIG. 1). A partition wall 42 is arranged on passages of the first material gas supply pipes 21 and the second material gas supply pipes 22. The partition wall 42 is a quartz plate extending inside the cover 24 in a horizontal direction. A space inside the cover 24 is partitioned into upper and lower parts by the partition wall 42. The partition wall 42 functions as a heat insulator.

Figure 2:
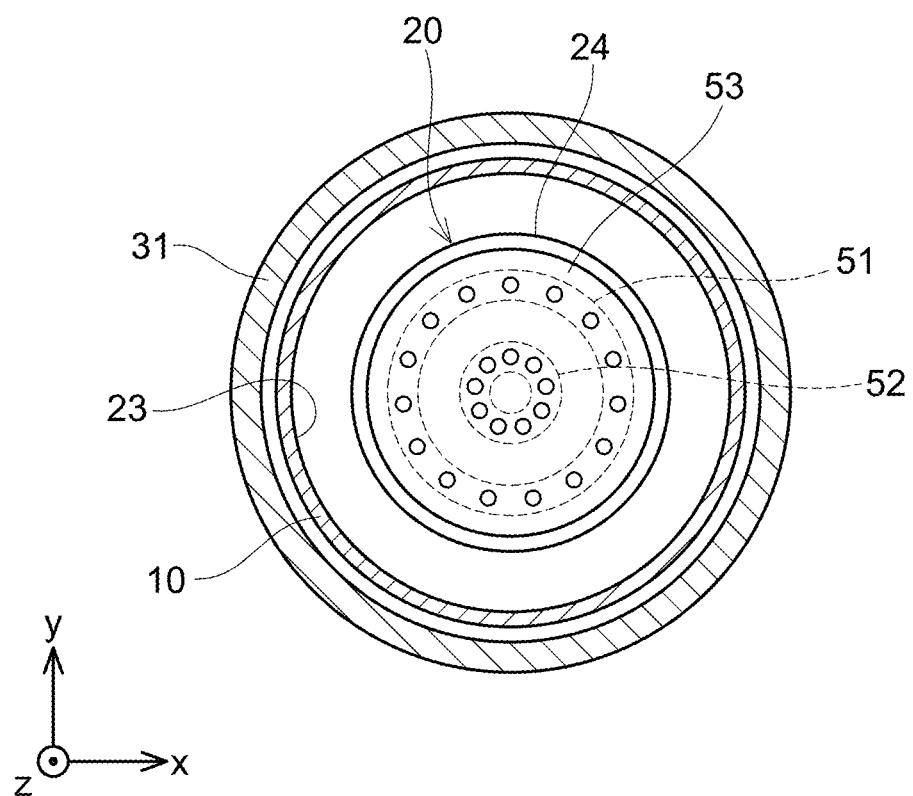
FIG. 2 is a view seeing a cross-section along a line II-II from vertically above.

The shower head 50 is a unit configured to discharge the first material gas G1 and the second material gas G2 to a vicinity of a surface of a wafer 13. The first material gas G1 and the second material gas G2 discharged from the shower head 50 flows within the reactor vessel 10 vertically upward in a direction of arrows Y1. A structure of the shower head 50 will be described with reference to FIG. 2. FIG. 2 sees a cross-sectional view along a line II-II of FIG. 1 from vertically above. A plurality of first gas supply inlets 51 configured to discharge the first material gas G1 and a plurality of second gas supply inlets 52 configured to discharge the second material gas G2 are provided on a surface of the shower head 50. By discharging the first material gas G1 and the second material gas G2 from such pluralities of gas supply inlets, a gas supply amount to a surface of the wafer 13 can be uniformized over an entire wafer surface.

A gas exhaust pipe 23 configured to exhaust the gases in the reactor vessel 10 is provided around the material gas supply unit 20. This will be described with reference to FIG. 2. The cylindrical material gas supply unit 20 is further arranged inside the cylindrical reactor vessel 10. Due to this, a ring-shaped gap is defined between an inner wall of the reactor vessel 10 and an outer wall of the cover 24 of the material gas supply unit 20. This ring-shaped gap functions as the gas exhaust pipe 23. As such, as shown by arrows Y2 in FIG. 1, the first material gas G1 and the second material gas G2 that were used for GaN crystal growth on the surface of the wafer 13 can be exhausted in a lateral side surface direction of the shower head 50 and a downward direction from the wafer 13. An outlet 23b of the gas exhaust pipe 23 is arranged at a lower end of the reactor vessel 10. The gases suctioned in from an inlet 23a of the gas exhaust pipe 23 are discharged from the outlet 23b to a vent line.

The wafer holder 11 is arranged in the reactor vessel 10. The wafer holder 11 is provided with a wafer holding part 12 on its lower surface. The wafer holding part 12 is configured to hold the wafer 13 such that the surface of the wafer 13 is directed vertically downward. "Vertically downward" is not limited to a configuration in which a normal line of the wafer matches a vertically downward direction. It is a concept encompassing inclinations of the normal line of the wafer up to 45 degrees with respect to the vertically downward direction.

A lower end of a rotary shaft 14 is connected to an upper portion of the wafer holder 11. An upper end of the rotary shaft 14 protrudes outside of the reactor vessel 10. The upper end of the rotary shaft 14 is connected to a drive mechanism 15. Due to this, the wafer holder 11 is enabled of rotation and up and down movements within the reactor vessel 10.

Particular gas supply pipes 16 are provided at an upper portion of the reactor vessel 10. A particular gas G3 is supplied to inlets of the particular gas supply pipes 16. The particular gas G3 flows vertically downward from above the wafer holder 11 as shown by arrows Y3 in FIG. 1 and is suctioned into the inlet 23a of the gas exhaust pipe 23. Due to this, a downflow can be generated by the particular gas G3. The particular gas G3 is gas that does not contain oxygen, and is gas that does not react with the first material gas G1 nor the second material gas G2. As a specific example, the particular gas G3 may be gas containing at least one of hydrogen, nitrogen, helium, neon, argon, or crypton.

An upper heater 31 and a lower heater 32 are arranged outside the reactor vessel 10. A partition wall 42 is arranged in a vicinity of a boundary between a region H1 where the upper heater 31 is arranged and a region H2 where the lower heater 32 is arranged. The upper heater 31 is arranged to surround circumferences of the wafer holder 11 and the shower head 50. A region around the wafer holder 11 is a region that must maintain a temperature that is sufficient for GaN crystal growth (1050±50° C.). The lower heater 32 is arranged to surround a circumference of the first material gas generation unit 41. The first material gas generation unit 41 is a region that must maintain a temperature required for stable generation of GaCl (750° C.) or higher.

<Structure of Shower Head 50>

The shower head 50 is a composite ceramic sintered body of BN (boron nitride) and $Si_3N_4$ (silicon nitride). The shower head 50 is obtained by mixing BN and $Si_3N_4$ powder by a ratio of 1:1, adding a binder, kneading a mixture thereof, and firing at 2000° C. The binder is a solidifier for shaping the powder. The binder in the present embodiment contains MgO and CaO. By forming the shower head 50 itself by the ceramic sintered body, the ceramic sintered body can be arranged in vicinities of the first gas supply inlets 51 for supplying the first material gas G1 to a vicinity of the wafer holder 11 and of the second gas supply inlets 52 for supplying the second material gas G2 to the vicinity of the wafer holder 11.

Figure 3:
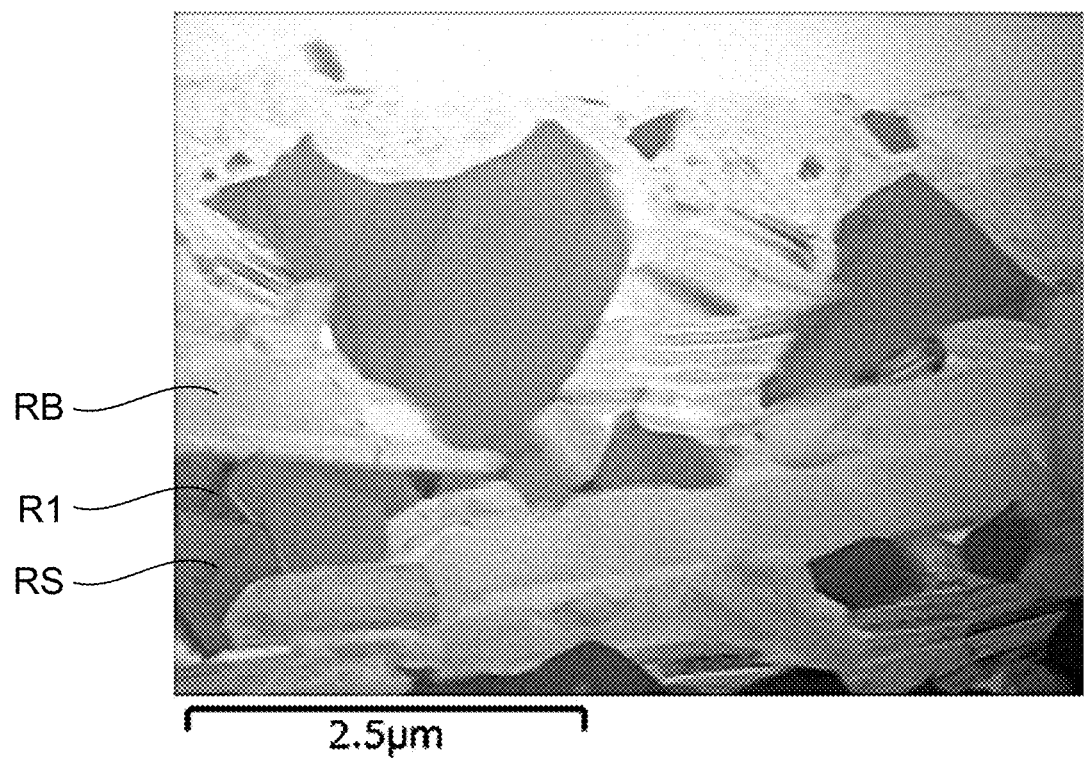
FIG. 3 is a partially enlarged STEM image of a cross section in a vicinity of a surface of a shower head prior to use.
Figure 4:
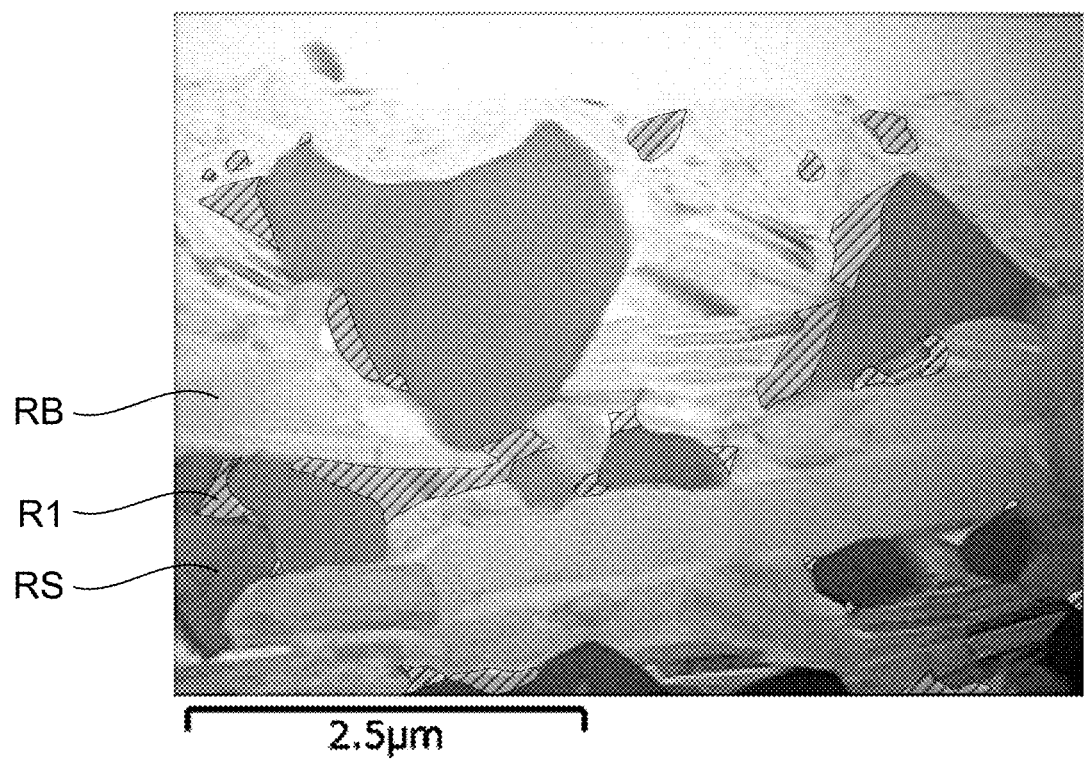
FIG. 4 is a diagram visualizing a part of the partially enlarged STEM image of the cross section in the vicinity of the surface of the shower head.

FIG. 3 shows a partially enlarged STEM image of a cross section in a vicinity of the surface of the shower head 50 prior to use. For easier understanding, a diagram visualizing a part of the image of FIG. 3 is shown in FIG. 4. FIGS. 3 and 4 are diagrams observing a same portion. In FIGS. 3 and 4, light gray regions are silicon nitride regions RS. In FIGS. 3 and 4, white regions are boron nitride regions RB. Regions constituted of these silicon nitride regions RS and boron nitride regions RB are "mother region". The mother region is a region that does not decompose at the temperature sufficient for the GaN crystal growth (1050±50° C.).

Dark gray regions in FIG. 3 and regions indicated by hatching in FIG. 4 are first regions R1. The first regions R1 are regions formed by firing the binder kneaded into the mother region. The first regions R1 are regions that decompose at the temperature sufficient for the GaN crystal growth (1050±50° C.). As aforementioned, the shower head 50 is formed by kneading and shaping the BN powder, $Si_3N_4$ powder, and binder. As such, as shown in FIGS. 3 and 4, the first regions R1 are arranged unevenly and continuously within the silicon nitride regions RS and the boron nitride regions RB being the mother region by being mixed therein.

The binder of the present application contains MgO and CaO as aforementioned. Due to this, the shower head 50 contains Mg at 1.5 (weight %) and Ca at 1.0 (weight %). Further, Mg and Ca are primarily present in the first regions R1.

Figure 5:
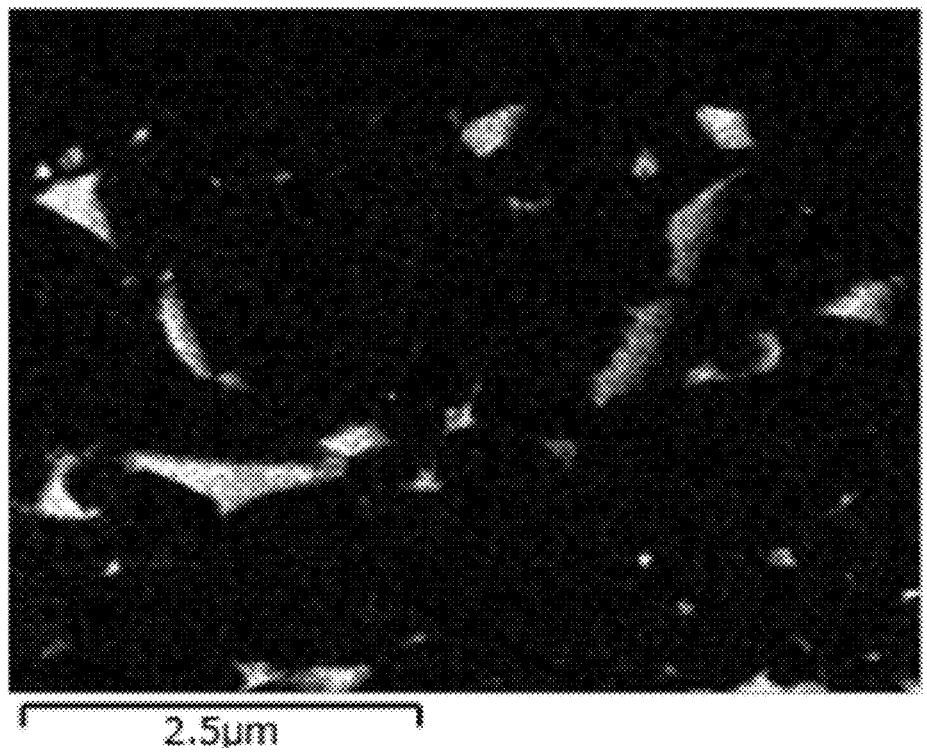
FIG. 5 shows an EDX analysis result of Mg.
Figure 6:
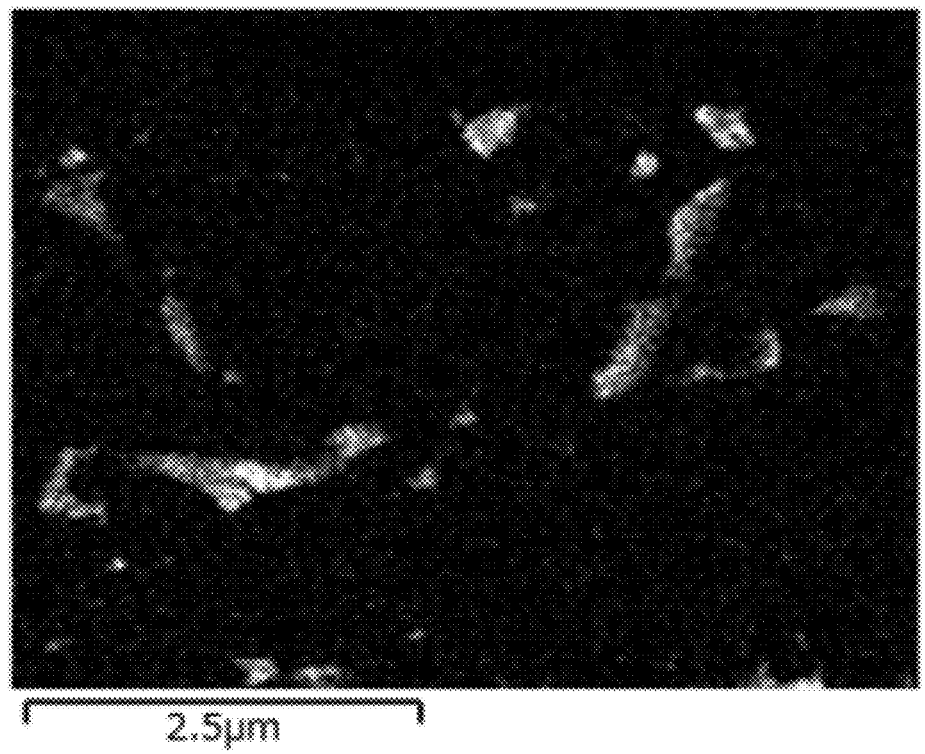
FIG. 6 shows an EDX analysis result of Ca.

An analysis result obtained by EDX (energy-dispersive X-ray spectroscopy) indicating that Mg and Ca are present in the first regions R1 will be described. FIG. 5 shows an analysis result for Mg. FIG. 6 shows an analysis result for Ca. FIGS. 5 and 6 are measurement results from the same portion as that of FIGS. 3 and 4. In FIG. 5, an image thereof is processed so that regions with a higher Mg concentration are brighter. In comparing FIGS. 4 and 5, it can be understood that Mg is contained in the first regions R1. Similarly, in FIG. 6, an image thereof is processed so that regions with a higher Ca concentration are brighter. In comparing FIGS. 4 and 6, it can be understood that Ca is contained in the first regions R1.

<Vapor Phase Epitaxial Growth Method>

A method of performing vapor phase epitaxial growth of GaN crystal on the wafer 13 by a HVPE method using the vapor phase epitaxial growth device 1 will be described. An example of vapor phase epitaxial growth conditions is hereby listed. Supply amounts of GaCl in the first material gas G1 and $NH_3$ in the second material gas G2 are set to a mole ratio of 1:20. A pressure in the reactor vessel 10 is set to 1000 hPa.

By turning on the upper heater 31, the wafer holder 11 and the shower head 50 are heated to 1050±50° C. By turning on the lower heater 32, the first material gas generation unit 41 is heated to 750° C. By opening the first valves 61 and the second valves 62, supplies of the first material gas G1 and the second material gas G2 are started.

With the shower head 50 heated, the first regions on the surface of the shower head 50 and the first regions in the inner walls of the first gas supply inlets 51 and the second gas supply inlets 52 are decomposed. Due to this, gas containing Mg is thereby supplied into the reactor vessel 10. Mg that has been supplied is mixed with the first material gas G1 and the second material gas G2 and is supplied to the wafer holder 11. Due to this, a constant amount of Mg can be supplied from the shower head 50. A GaN crystal doped with Mg can be grown on the wafer 13.

Further, the second material gas G2 contains $NH_3$. MgO contained in the first regions of the shower head 50 can be reduced by this $NH_3$. Due to this, Mg can efficiently be supplied from the shower head 50. Further, the first material gas G1 contains Cl. The first regions of the shower head 50 can be etched by this Cl. Due to this, Mg can efficiently be supplied from the shower head 50.

The supply amount of Mg supplied from the shower head 50 can be controlled by various parameters. For example, in a case of increasing the Mg supply amount, the heating temperature of the shower head 50 may be increased, a density of the first regions contained in the shower head 50 may be increased and/or a distance between the shower head 50 and the wafer holder 11 may be shortened.

<Effects>

Figure 7:
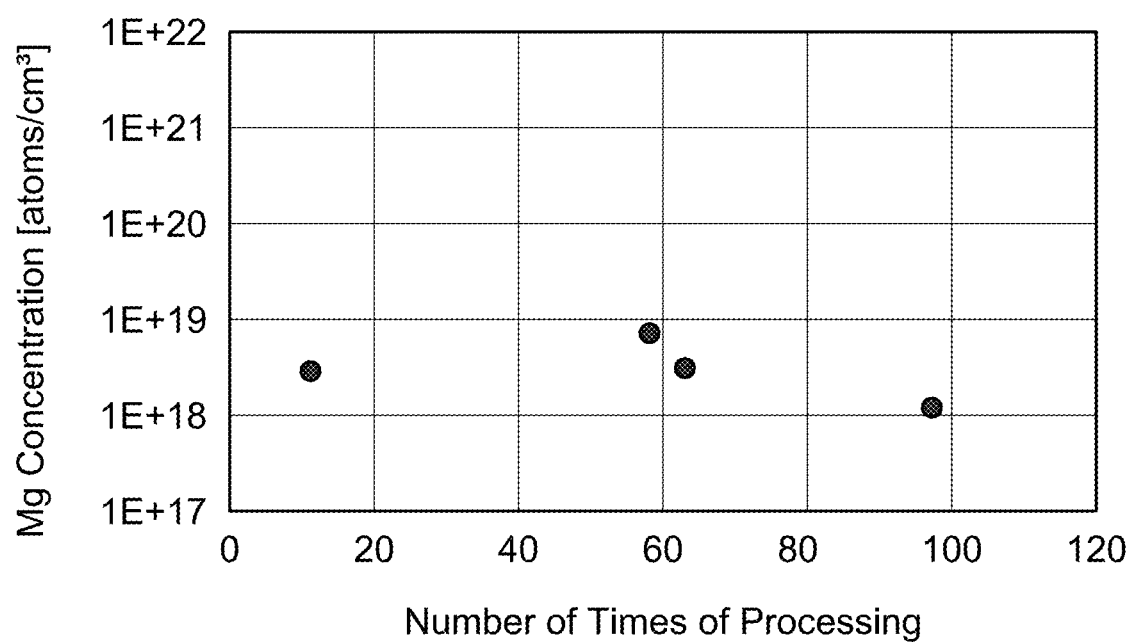
FIG. 7 shows SIMS measurement results of a Mg content in a GaN crystal.

FIG. 7 shows a SIMS measurement result of a Mg content in the GaN crystal grown by using the vapor phase epitaxial growth device 1 of the present embodiment. A horizontal axis is the number of times of processing by the vapor phase epitaxial growth device 1. A vertical axis is a Mg concentration in the GaN crystal. As can be understood from FIG. 7, the Mg content contained in the grown GaN crystal can be made substantially at a constant amount regardless of the number of times of processing by the vapor phase epitaxial growth device 1. Reason thereof will be described below.

Figure 10:
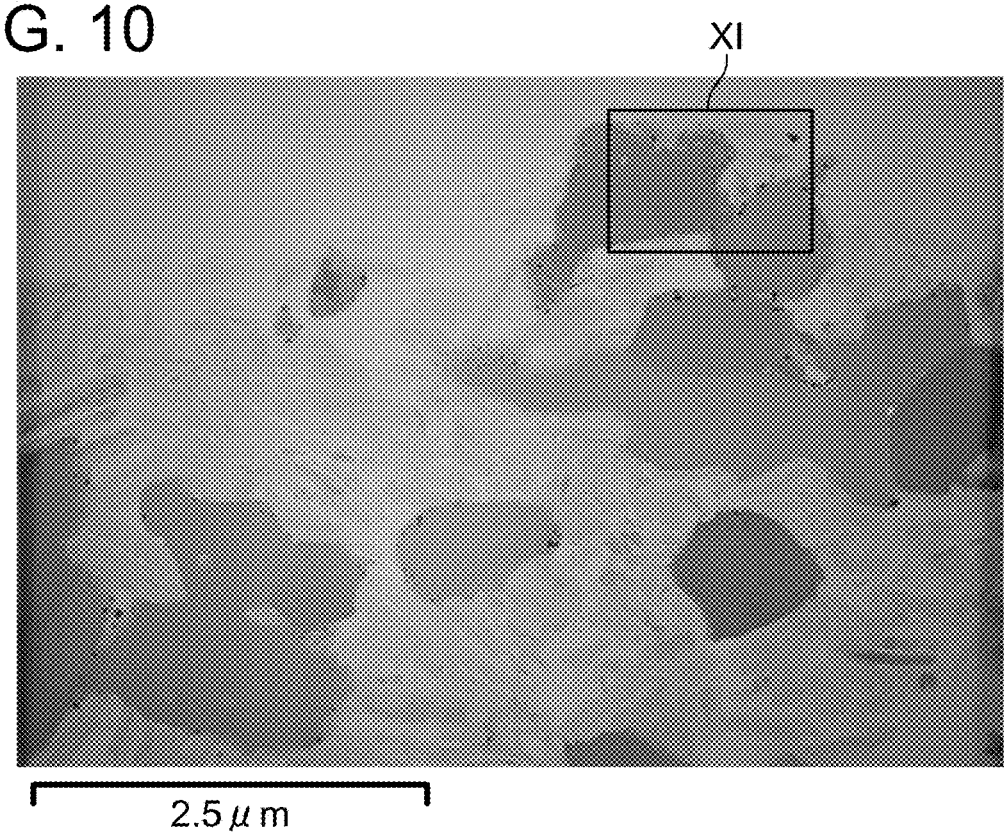
FIG. 10 is a partially enlarged STEM image of the surface of the shower head after use.
Figure 11:
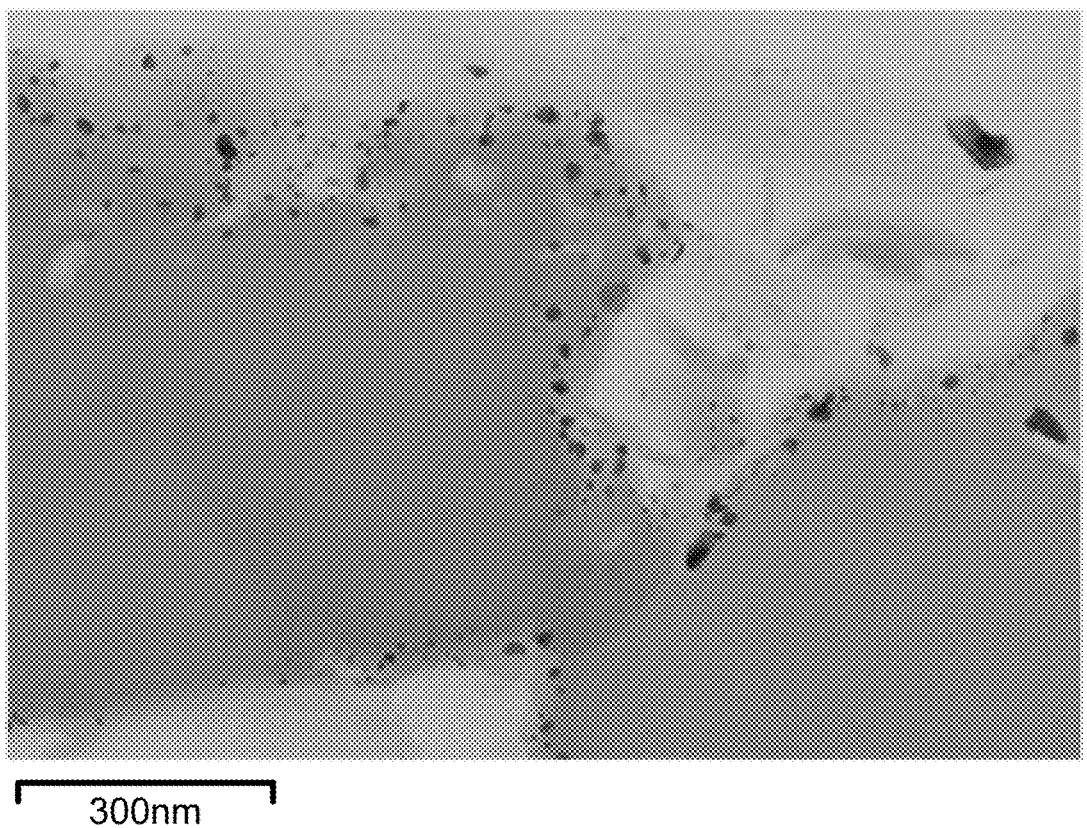
FIG. 11 is a partially enlarged STEM image of FIG. 10.

FIG. 10 is a partially enlarged STEM image of a cross section in the vicinity of the surface of the shower head 50 after use. FIG. 10 is an image with substantially same magnification as the STEM image of FIG. 3, however, it observes a portion different from that of FIG. 3. Further, FIG. 11 shows an enlarged view of a region XI of FIG. 10. A difference between FIGS. 10, 11 and FIG. 3 is that the former shows the shower head 50 after use and the latter prior to use. As shown in FIGS. 10 and 11, it can be understood that voids are formed in the first regions R1 by using the shower head 50.

Figure 12:
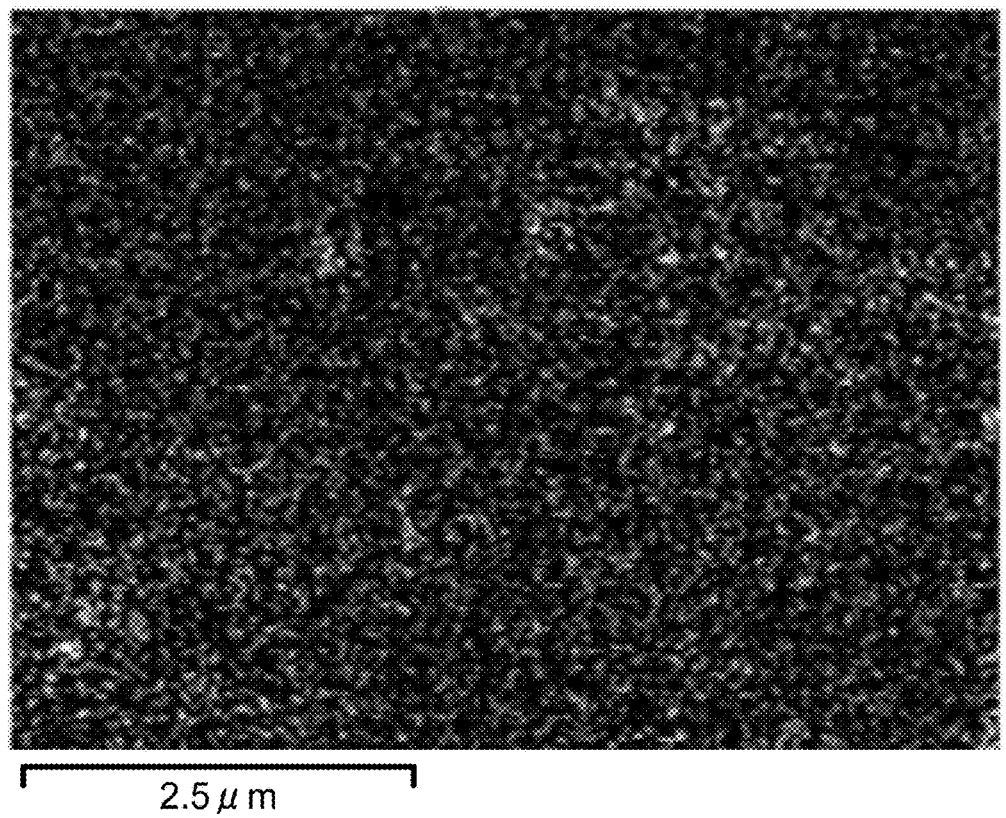
FIG. 12 shows an EDX analysis result of Mg.
Figure 13:
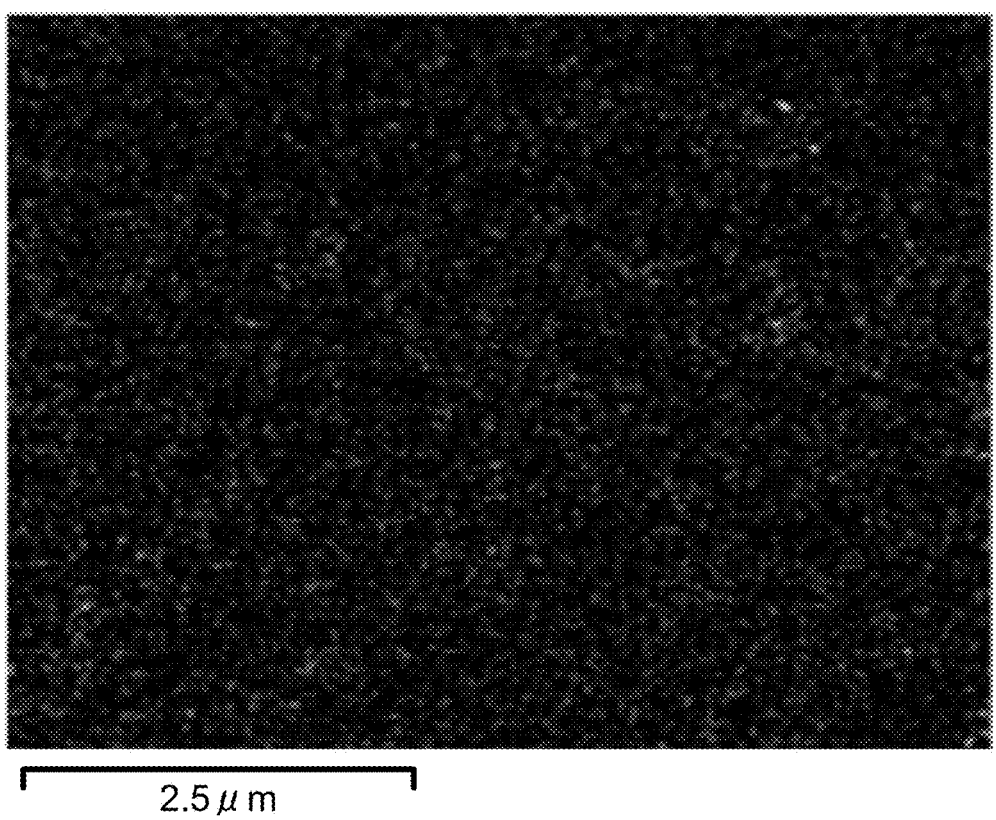
FIG. 13 shows an EDX analysis result of Ca.

EDX analysis results will be described in FIGS. 12 and 13. FIGS. 12 and 13 are measurement results of a same portion as that of FIG. 10. FIG. 12 shows the analysis result of Mg. FIG. 13 shows the analysis result of Ca. In FIGS. 12 and 13, images thereof are processed so that regions with higher Mg concentration and regions with higher Ca concentration are brighter. FIGS. 12 and 13 are images with substantially same magnification as FIGS. 5 and 6. In FIGS. 5 and 6, the bright regions are observed unevenly and continuously. That is, it can be understood that Mg and Ca are contained in the first regions R1 in a state of the shower head 50 prior to use. On the other hand, in FIGS. 12 and 13, the bright regions could only be confirmed at a noise level. That is, in a state of the shower head 50 after use, it can be understood that hardly any Mg and Ca are present on the surface of the shower head 50 due to decomposition of the first regions R1 progressing by the use.

Figure 8:
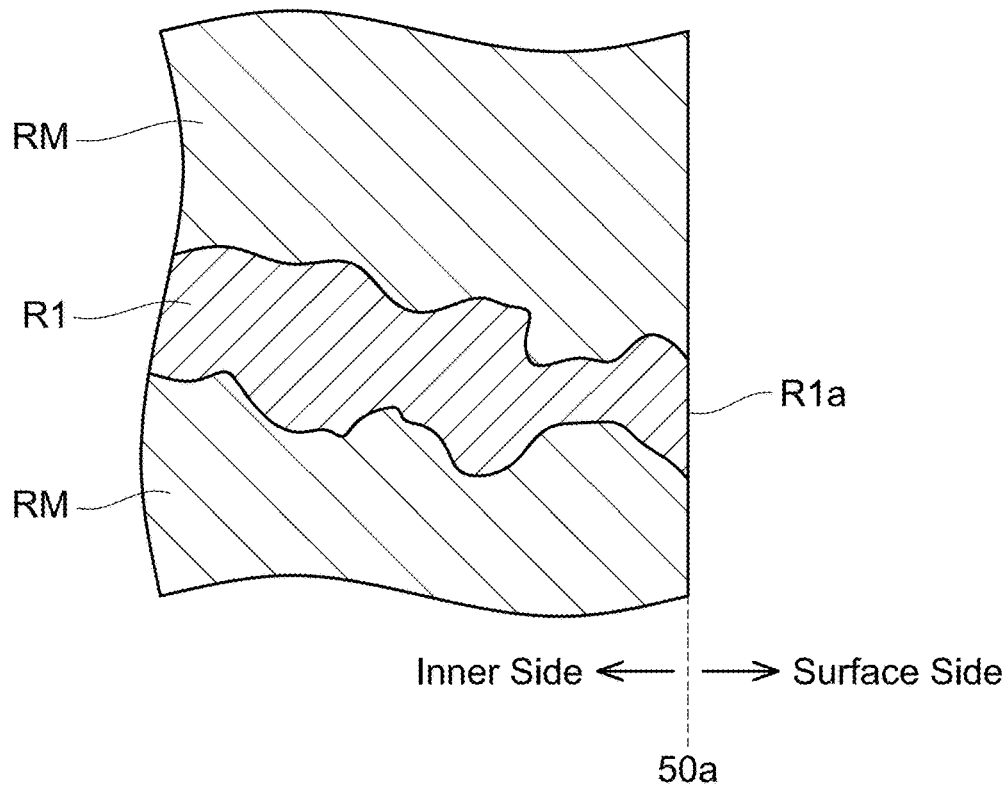
FIG. 8 is a cross-sectional schematic view of the vicinity of the surface of the shower head prior to use.
Figure 9:
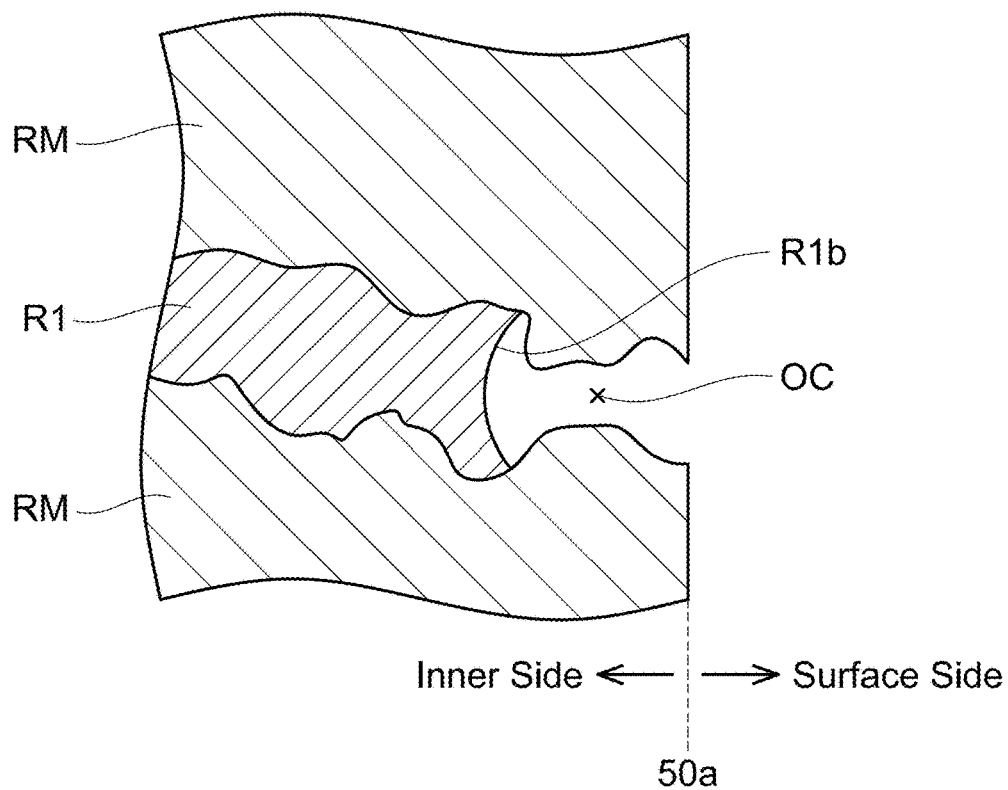
FIG. 9 is a cross-sectional schematic view of the vicinity of the surface of the shower head after use.

A model of progress of the decomposition of the first regions R1 will be described. FIGS. 8 and 9 show cross-sectional schematic views of the vicinity of a surface 50a of the shower head 50. FIG. 8 shows the state of the shower head 50 prior to use and FIG. 9 shows the state of the shower head 50 after use. In FIGS. 8 and 9, a left side of the surface 50a is an inner side. As shown in FIG. 8, the first region R1 is arranged continuously within the mother region RM. In the state of FIG. 8, no void is yet formed. As such, as shown in FIGS. 5 and 6, it is in the state where Mg and Ca are present on the surface 50a. When the shower head 50 is used, the shower head 50 is heated. By doing so, the first region R1 decomposes from its exposed surface R1a, by which Mg and Ca are supplied. As a cumulative number of times of processing increases and the decomposition of the first region R1 progresses, the first region R1 is recessed inward from the surface R1a. As such, as shown in FIG. 9, a continuous void OC is thereby formed. In the state of FIG. 9, the surface 50a is in the state where Mg and Ca are hardly present thereon as shown in FIGS. 12 and 13. However, the gas containing Mg and Ca can be supplied from a surface R1b of the first region R1 on the deeper inner side of the shower head 50 with the continuous void OC as a supply passage. Due to this, a constant amount of Mg can be supplied from the shower head 50. As compared to a case of using Mg metal, the supply amount of Mg can be controlled to be constant.

The first regions R1 contains not only Mg but also Ca, which is alkaline earth metal other than Mg. An effect thereof will be described. By containing Ca, the first regions R1 are configured as mixed crystals containing Mg, Ca, and O. Due to this, the first regions R1 can be configured to withstand thermal decomposition as compared to a case of solely using MgO. That is, by adding the alkaline earth metal other than Mg to the first regions R1 and reducing a thermal decomposition speed, a rate of chronological change in the supply amount of Mg can be made small.

Second Embodiment

Figure 14:
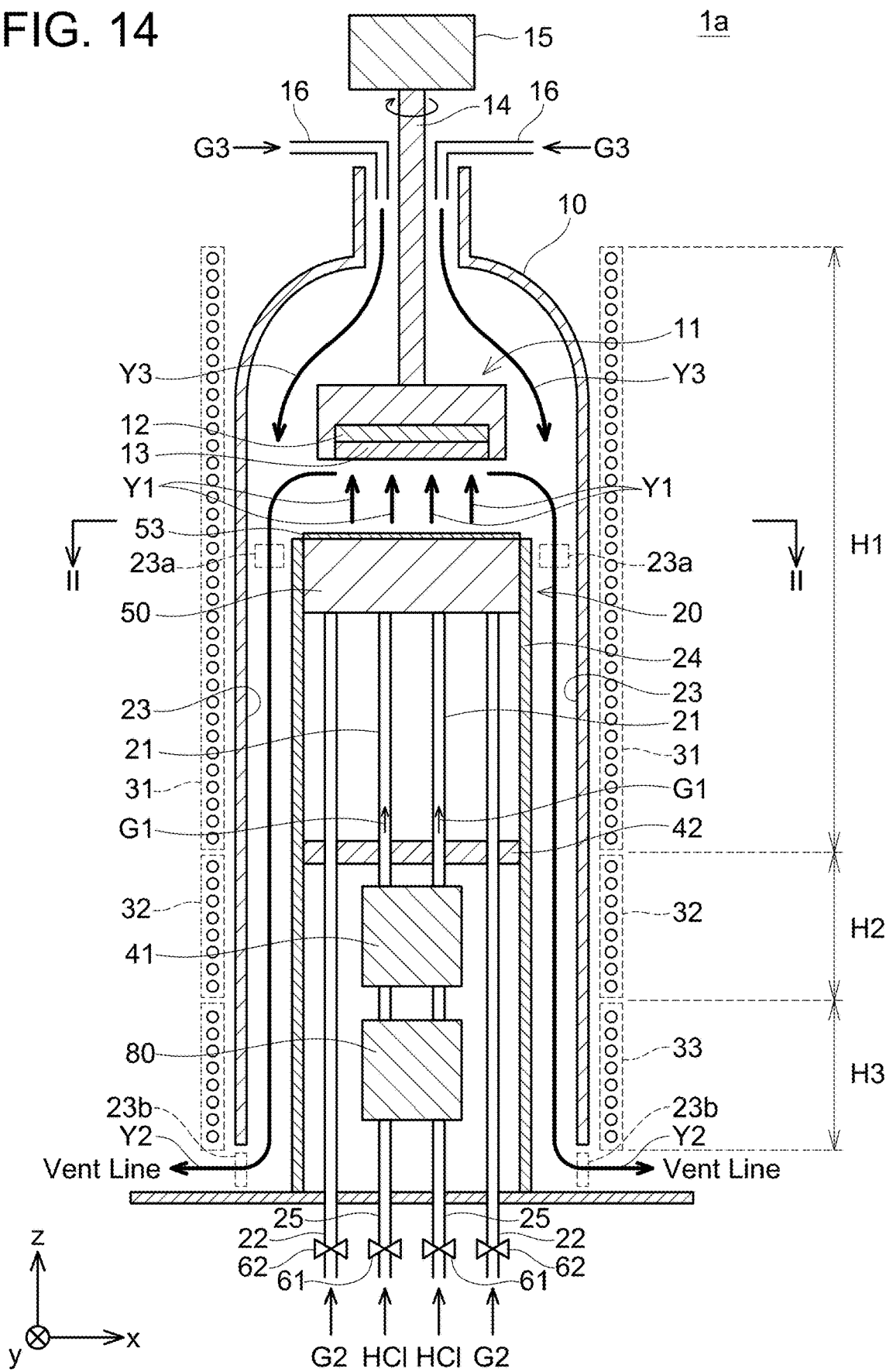
FIG. 14 is a schematic cross-sectional view seeing a vapor phase epitaxial growth device of a second embodiment along a lateral direction.

FIG. 14 shows a schematic cross-sectional view seeing a vapor phase epitaxial growth device 1a according to a second embodiment along the lateral direction. The vapor phase epitaxial growth device 1a of the second embodiment further includes a Mg supplying unit 80 on the passages of HCl gas supply pipes 25 in the vapor phase epitaxial growth device 1 of the first embodiment. Constituent features that are same as those of the vapor phase epitaxial growth device 1 of the first embodiment are given same reference signs, thus detailed descriptions thereof will be omitted.

The Mg supplying unit 80 houses therein a ceramic sintered body that is not shown. This ceramic sintered body is of a same material as the shower head 50 of the first embodiment, and thus includes first regions R1. A heater 33 is arranged in a region H3 surrounding the first material gas generation unit 41. The region H3 is a region that must maintain a temperature that is sufficient for decomposing the first regions R1 and generate Mg.

In growing the GaN crystal by vapor-phase epitaxial growth, the ceramic sintered body inside the Mg supplying unit 80 is heated by turning on the heater 33. Further, the HCl gas is supplied to the first material gas generation unit 41 through the Mg supplying unit 80. With the first regions inside the Mg supplying unit 80 being thermally decomposed, the HCl gas containing Mg can be supplied to the first material gas generation unit 41. Due to this, a constant amount of Mg can be supplied from the Mg supplying unit 80.

Third Embodiment

Figure 15:
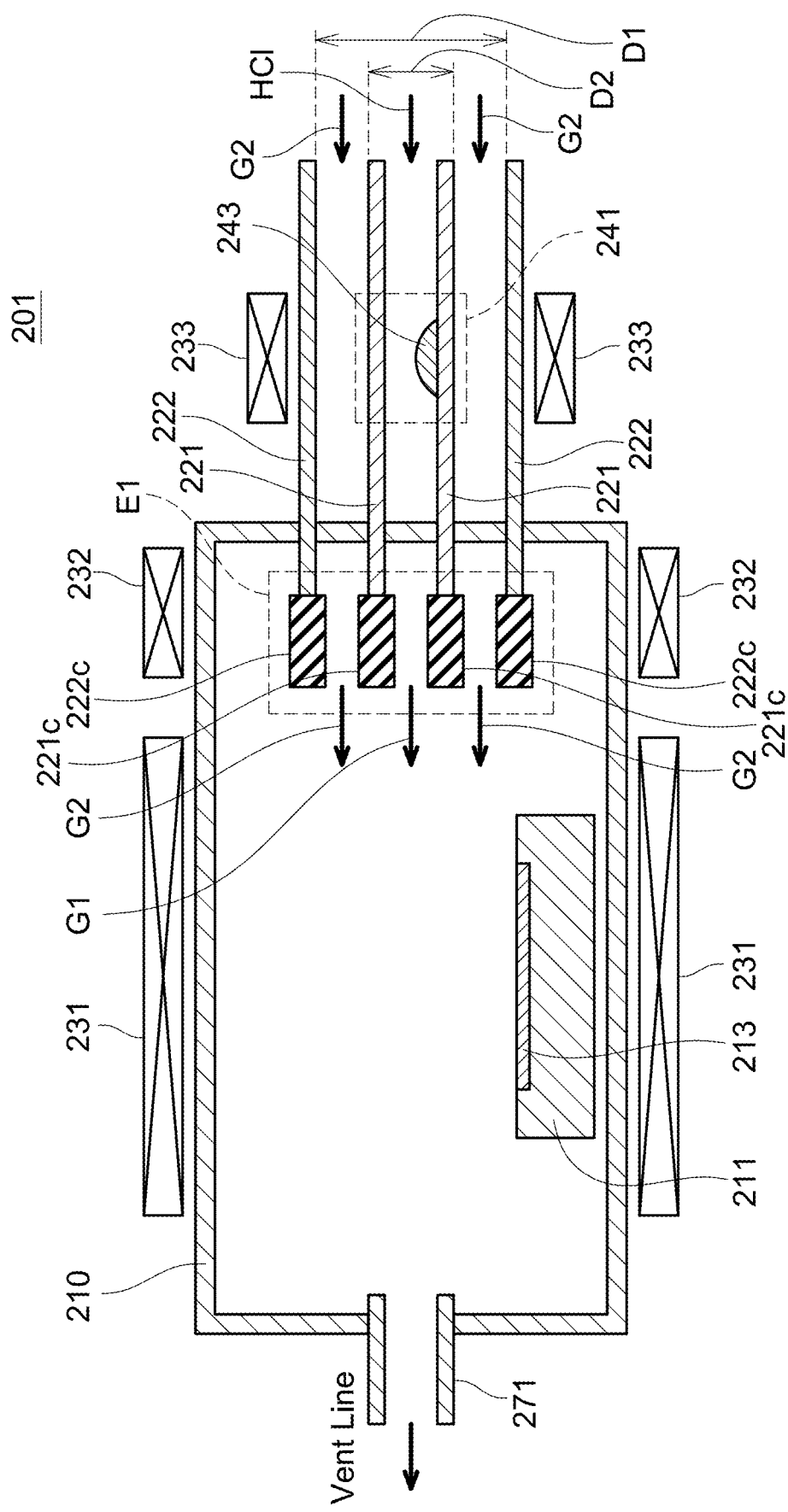
FIG. 15 is a schematic cross-sectional view seeing a vapor phase epitaxial growth device of a third embodiment along a lateral direction.

FIG. 15 shows a schematic cross-sectional view seeing a vapor phase epitaxial growth device 201 according to a third embodiment along the lateral direction. The vapor phase epitaxial growth device 201 is an example of a device configuration for carrying out the HVPE method. The vapor phase epitaxial growth device 201 is provided with a reactor vessel 210, a susceptor 211, a first material gas supply pipe 221, a second material gas supply pipe 222, and a gas exhaust pipe 271. The susceptor 211 is housed in the reactor vessel 210. A wafer 213 is held by a wafer holding surface of the susceptor 211.

The first material gas supply pipe 221 configured to supply the first material gas G1 and the second material gas supply pipe 222 configured to supply the second material gas G2 are connected to the reactor vessel 210. An inner diameter D1 of the second material gas supply pipe 222 is larger than an outer diameter D2 of the first material gas supply pipe 221. The first material gas supply pipe 221 is arranged inside the second material gas supply pipe 222. A clearance is secured between an outer wall of the first material gas supply pipe 221 and an inner wall of the second material gas supply pipe 222, and the second material gas G2 flows in this clearance. An end region E1 of the first material gas supply pipe 221 and the second material gas supply pipe 222 functions as a gas supply inlet. The first material gas supply pipe 221 is configured of a ceramic sintered body 221c and the second material gas supply pipe 222 is configured of a ceramic sintered body 222c in the end region E1. The ceramic sintered bodies 221c and 222c are of the same material as the shower head 50 of the first embodiment, and include first regions R1.

A first material gas generation unit 241 is arranged on a passage of the first material gas supply pipe 221. Metal gallium 243 is housed inside the first material gas generation unit 241. The HCl gas is supplied to an inlet of the first material gas supply pipe 221, and the first material gas G1 is discharged from a gas supply inlet. The second material gas G2 is supplied to an inlet of the second material gas supply pipe 222 and the second material gas G2 is discharged from a gas supply inlet. The gas exhaust pipe 271 is connected to the reactor vessel 210. The material gas used for the vapor phase epitaxial growth of GaN is discharged to a vent line through the gas exhaust pipe 271.

A heater 231 is arranged surrounding the susceptor 211 around an outer circumference of the reactor vessel 210. The heater 231 is a device configured to heat the wafer 213 by a hot wall scheme. Due to this, the wafer 213 can be maintained at the temperature sufficient for the GaN crystal growth (1050±50° C.). A heater 232 is arranged on an outer side of the reactor vessel 210 and surrounding the end region E1. Due to this, the ceramic sintered bodies 221c and 222c arranged at the end region E1 can be heated to generate Mg. A heater 233 is arranged on an outer side of the second material gas supply pipe 222 and surrounding the first material gas generation unit 241. Due to this, to generate GaCl, the first material gas generation unit 241 can be maintained to 750° C. or higher.

<Effects>

In the vapor phase epitaxial growth device 201 of the third embodiment, Mg can be supplied from the ceramic sintered bodies 221c and 222c arranged in a vicinity of the gas supply inlets (end region E1). The gas supply inlets are arranged in a vicinity of the wafer 213, thus Mg generated from the ceramic sintered bodies 221c and 222c can be supplied to the wafer 213 before reacting with an inner wall and the like of the reactor vessel 210. Mg can efficiently be supplied.

Fourth Embodiment

Figure 16:
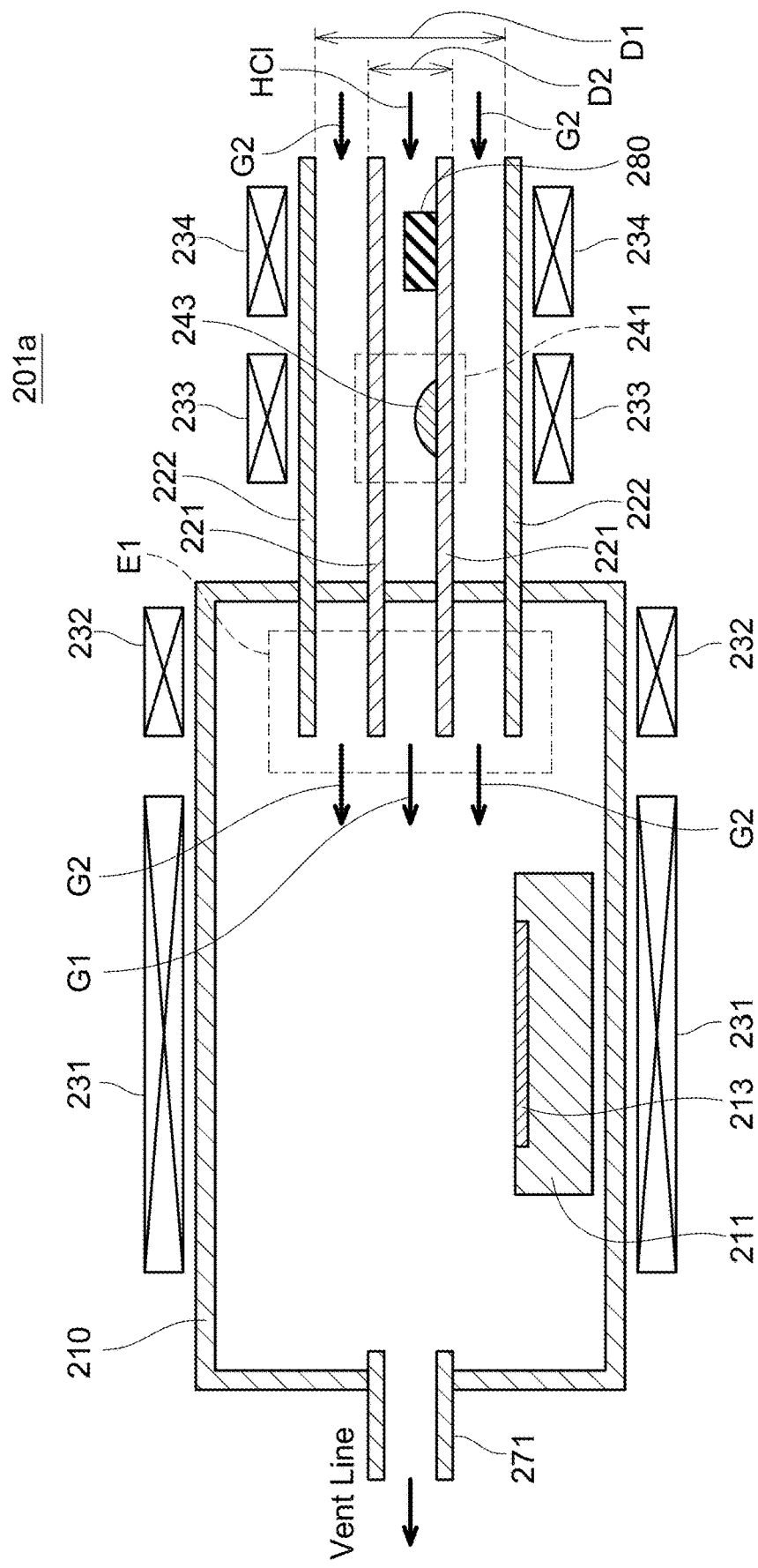
FIG. 16 is a schematic cross-sectional view seeing a vapor phase epitaxial growth device of a fourth embodiment along a lateral direction.

FIG. 16 shows a schematic cross-sectional view seeing a vapor phase epitaxial growth device 201a according to a fourth embodiment along the lateral direction. The vapor phase epitaxial growth device 201a of the fourth embodiment further includes a ceramic sintered body 280 and a heater 234 on the passage of the first material gas supply pipe 221 in the vapor phase epitaxial growth device 201 of the third embodiment. Constituent features that are same as those of the vapor phase epitaxial growth device 201 of the third embodiment are given same reference signs, thus detailed descriptions thereof will be omitted.

The ceramic sintered body 280 is configured of the same material as the shower head 50 of the first embodiment, and includes first regions R1. The heater 234 is arranged in a region surrounding the ceramic sintered body 280. In growing the GaN crystal by vapor-phase epitaxial growth, the ceramic sintered body 280 is heated by turning on the heater 234. Further, the HCl gas is supplied to the inlet of the first material gas supply pipe 221. With the first regions inside the ceramic sintered body 280 being thermally decomposed, the HCl gas containing Mg can be supplied to the metal gallium 243. Due to this, a constant amount of Mg can be supplied from the ceramic sintered body 280.

Fifth Embodiment

Figure 17:
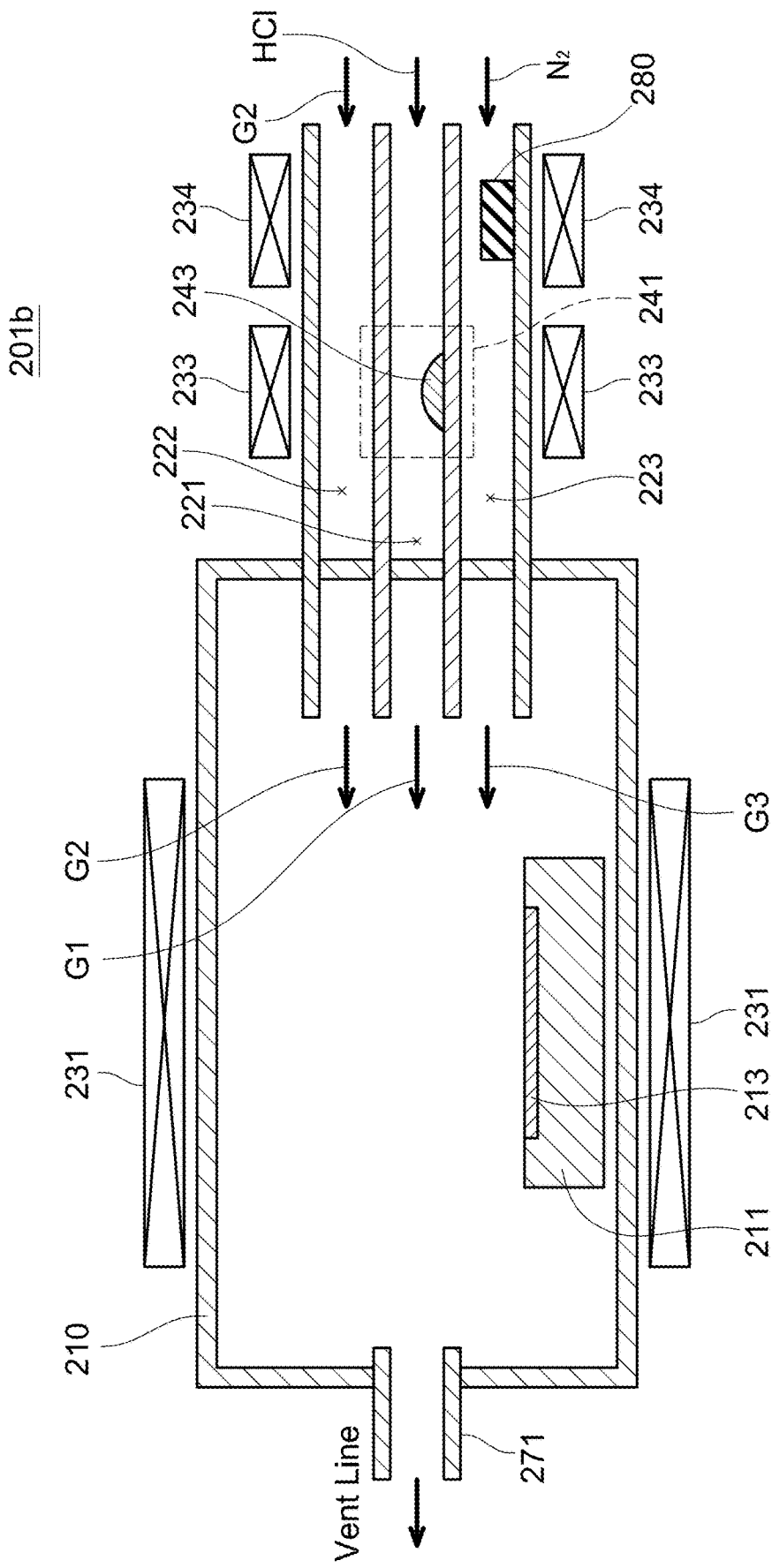
FIG. 17 is a schematic cross-sectional view seeing a vapor phase epitaxial growth device of a fifth embodiment along a lateral direction.

FIG. 17 shows a schematic cross-sectional view seeing a vapor phase epitaxial growth device 201b according to a fifth embodiment along the lateral direction. The vapor phase epitaxial growth device 201b of the fifth embodiment differs from the vapor phase epitaxial growth device 201a of the fourth embodiment in its configuration for supplying Mg from the ceramic sintered body 280. The vapor phase epitaxial growth device 201b is further provided with a third material gas supply pipe 223 configured to supply third material gas G3 containing Mg to the reactor vessel 210. $N_2$ is supplied to an inlet of the third material gas supply pipe 223 as carrier gas. The ceramic sintered body 280 is arranged on a passage of the third material gas supply pipe 223. In the present embodiment, the ceramic sintered body 280 is a diced SBN (composite ceramic of BN and silicon nitride ($Si_3N_4$)). By increasing a surface area by dicing, a supply amount of Mg from the SBN can be increased. In growing the GaN crystal by vapor-phase epitaxial growth, the ceramic sintered body 280 is heated by turning on the heater 234. With the first regions inside the ceramic sintered body 280 being thermally decomposed, the third material gas G3 containing Mg can be supplied to the reactor vessel 210. Constituent features that are same as those of the vapor phase epitaxial growth devices 201 and 201a of the third and fourth embodiments are given same reference signs, thus detailed descriptions thereof will be omitted.

<Vapor Phase Epitaxial Growth Method>

An example of vapor phase epitaxial growth conditions will be listed. The wafer 213 that is to be a support substrate is prepared by growing 3 μm of GaN on a surface of a sapphire substrate by a MOVPE method. Further, the following growth conditions are used. A growing time: 15 [minutes], a heating temperature of the wafer 213: 1070 [° C.], a heating temperature of metal gallium 243: 850 [° C.], a heating temperature of the ceramic sintered body 280: 850 [° C.], a HCl flow rate in the first material gas supply pipe 221: 40 [sccm], a flow rate of the second material gas G2 (ammonia) in the second material gas supply pipe 222: 4 [slm], and a flow rate of $N_2$ in the third material gas supply pipe 223: 25960 [sccm]. Further, 25 μm of a Mg-doped GaN layer in which Mg is doped is grown.

<SIMS Analysis Results>

FIG. 18 shows measurement results by a secondary-ion mass spectrometry (SIMS) of the Mg-doped GaN layer grown under the above conditions. A vertical axis is the Mg concentration [atoms/cm$^3$]. A horizontal axis is a depth [μm] from the surface of the GaN crystal. A concentration profile P1 is a measurement result of the Mg-doped GaN layer. A concentration profile P2 is a measurement result of a GaN layer of a comparative example in which Mg is not doped. The undoped GaN layer of the comparative example can be produced by growing the GaN crystal without supplying the third material gas G3. The Mg concentration of the Mg-doped GaN layer (concentration profile P1) is in a range of $1 \times 10^{18}$ to $9 \times 10^{18}$[Atoms/cm$^3$]. On the other hand, the Mg concentration of the undoped GaN layer of the comparative example (concentration profile P2) is in a range of $2 \times 10^{14}$ (detection limit DL) to $2 \times 10^{15}$[Atoms/cm$^3$]. Thus, it can be understood that magnesium can be doped by the method of the fifth embodiment at a concentration that is 1000 times or more than that of the undoped GaN layer. A fluctuation pattern of the concentration profile P1 is expected as being a fluctuation caused by impurity intake in macro-step progression on the crystal surface.

<Modification>

An embodiment of the present invention has been described in detail with reference to the drawings, however, this is a mere exemplary indication and thus does not limit the scope of the claims. The art described in the claims includes modifications and variations of the specific examples presented above.

The configurations in which a solid unit (such as the shower head 50, the ceramic sintered body in the Mg supplying unit 80, the ceramic sintered bodies 221c and 222c, and the ceramic sintered body 280) is arranged on a supply passage of material gas such as a first material gas supply pipe and a second material gas supply pipe have been described, however, no limitation is made to such configurations. A carrier gas supply pipe configured to supply carrier gas such as $H_2$ and $N_2$ may be provided, and the solid unit may be arranged on a passage of this carrier gas supply pipe. That is, a pipe for supplying the gas containing Mg may be used as the supply pipe of the material gas, or a dedicated pipe for supplying the gas containing Mg may be provided.

The configurations in which the solid unit is configured of the ceramic sintered body have been described, however, no limitation is made to such configurations, and the solid unit may be configured of high melting-point metal. Examples of the high melting-point metal may be tungsten, tantalum, molybdenum, niobium, and alloys thereof.

A mother region may be of any material so long as the material is capable of continuously arranging first regions R1 without decomposing at a temperature sufficient for GaN crystal growth. For example, it may be metal.

In the second embodiment (FIG. 14), the configuration in which the Mg supplying unit 80 is arranged on the passage of the first material gas G1 has been described, however, no limitation is made to such a configuration. The Mg supplying unit 80 may be arranged on at least one of the passages of the first material gas G1 or the second material gas G2. As such, the Mg supplying unit 80 may be arranged on each of the passages of the first material gas G1 and the second material gas G2.

The configuration of kneading the binder into the mother region has been described as the configuration of continuously arranging the first regions R1 in the mother region, however, no limitation is made to such a configuration. The first regions R1 may continuously be arranged in the mother region by immersing a mother body in which continuous voids are formed in liquid for forming the first regions.

A part of the shower head 50 instead of an entirety of the shower head 50 may be configured of the ceramic sintered body. For example, a main surface or a side surface of the shower head 50 may be configured of the ceramic sintered body.

Gas for supplying Mg from the ceramic sintered body is not limited to gas containing $NH_3$ and Cl. Carrier gas such as $H_2$ and $N_2$ may be used.

An inorganic compound configuring the ceramic sintered body is not limited to boron nitride and silicon nitride, and other inorganic compounds may be used. Further, in a case of forming the ceramic sintered body by a mixture of two types of inorganic compounds, a mixture ratio thereof is not limited to 1:1, and may freely be set. Further, the ceramic sintered body may be formed of a sole inorganic compound.

Ca has been explained as alkaline earth metal other than Mg contained in the first regions R1, however, no limitation is made to such a configuration. A metallic element belonging to an alkaline earth metal group such as beryllium (Be), strontium (Sr), barium (Ba), and radium (Ra) may be used. Further, the first regions R1 may contain other element or compounds. For example, the first regions R1 may contain an inorganic compound having a decomposition temperature different from that of MgO. By adjusting a mixed amount of the inorganic compound, a decomposition speed of the thermally decomposing first regions R1 and a supply amount of Mg can be made controlled. For example, at least one of aluminum oxide ($Al_2O_3$), boron oxide ($B_2O_3$), silicon oxide ($SiO_2$), yttrium oxide ($Y_2O_3$), aluminum nitride (AlN), silicon nitride ($Si_3N_4$), or boron nitride (BN) may be contained.

The temperature sufficient for the GaN crystal growth has been explained as 1050±50° C. Further, the temperature necessary for the generation of GaCl has been explained as 750° C. or higher. However, these temperatures are mere examples. For example, the temperature sufficient for the GaN crystal growth may be in a range of 1050±100° C.

Cases in which the first material gas G1 is a gas containing GaCl has been described, however, no limitation is made to this configuration. The first material gas G1 may be any gas having whatever chemical composition so long as it is a gas containing Ga. For example, the first material gas G1 may be a gas containing gallium trichloride ($GaCl_3$). In this case, a growing temperature of about 1300° C. may be used. GaN crystal growth may be performed on a N-plane (-c plane). Due to this, a GaN crystal surface can be enlarged as growth thereof progresses. Further, for example, the first material gas G1 may be gas solely containing Ga.

The numbers and arrangements of the first material gas supply pipes and the second material gas supply pipes described herein are mere examples, and no limitation is made to these configurations.

The art disclosed herein is not limited to GaN, and may be adapted to crystal growth of various other compound semiconductors. For example, it may be adapted to growth of GaAs crystal. In this case, arsine ($AsH_5$) may be used as the second material gas G2.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The shower head 50, the ceramic sintered body inside the Mg supplying unit 80, the ceramic sintered bodies 221c and 222c, and the ceramic sintered body 280 are examples of a solid unit.

The invention claimed is:

1. A vapor phase epitaxial growth device for a compound semiconductor, the device comprising:
   a reactor vessel;
   a wafer holder arranged in the reactor vessel;
   a first material gas supply pipe configured to supply first material gas to the reactor vessel;
   a second material gas supply pipe configured to supply second material gas, which is to react with the first material gas, to the reactor vessel;
   a particular gas supply pipe having a solid unit arranged on a supply passage; and
   a first heater unit configured to heat the solid unit to a predetermined temperature or higher, the predetermined temperature being a temperature sufficient for a GaN crystal growth,
   wherein
   the solid unit comprises a mother region and a first region arranged continuously within the mother region,
   the mother region is a region that does not decompose at the predetermined temperature, and
   the first region is a region that decomposes at the predetermined temperature and contains Mg.

2. The vapor phase epitaxial growth device according to claim 1, wherein the first region further contains alkaline earth metal other than Mg.

3. The vapor phase epitaxial growth device according to claim 1, wherein the first region further contains at least one of aluminum oxide, boron oxide, silicon oxide, yttrium oxide, aluminum nitride, silicon nitride, or boron nitride.

4. The vapor phase epitaxial growth device according to claim 1, wherein at least one of the first material gas supply pipe or the second material gas supply pipe is used as the particular gas supply pipe.

5. The vapor phase epitaxial growth device according to claim 4, wherein the solid unit is arranged in at least one of an inner wall of a first gas supply inlet configured to supply the first material gas to the wafer holder or an inner wall of a second gas supply inlet configured to supply the second material gas to the wafer holder.

6. The vapor phase epitaxial growth device according to claim 5, further comprising:
   a shower head having a plurality of the first gas supply inlets and a plurality of the second gas supply inlets,
   wherein at least a part of the shower head is configured by the solid unit.

7. The vapor phase epitaxial growth device according to claim 4, wherein the solid unit is arranged on at least one of a passage of the first material gas supply pipe or a passage of the second material gas supply pipe.

8. The vapor phase epitaxial growth device according to claim 1, wherein
the solid unit is a ceramic sintered body or tungsten, tantalum, molybdenum, niobium, or an alloy thereof,
the mother region is an inorganic compound, and
the first region is a substance obtained by firing a binder mixed in the inorganic compound for molding the inorganic compound prior to sintering the same.

9. The vapor phase epitaxial growth device according to claim 1, wherein
the first material gas is gas containing Ga, and
the second material gas is gas containing $NH_3$.

10. The vapor phase epitaxial growth device according to claim 1, wherein at least one of inert gas such as $N_2$, Ar, He, Xe, and Kr or gas such as $H_2$ is supplied to at least one of the first material gas supply pipe or the second material gas supply pipe as carrier gas.

11. The vapor phase epitaxial growth device according to claim 2, wherein
the solid unit is a ceramic sintered body or tungsten, tantalum, molybdenum, niobium, or an alloy thereof,
the mother region is an inorganic compound, and
the first region is a substance obtained by firing a binder mixed in the inorganic compound for molding the inorganic compound prior to sintering the same.

12. The vapor phase epitaxial growth device according to claim 3, wherein
the solid unit is a ceramic sintered body or tungsten, tantalum, molybdenum, niobium, or an alloy thereof,
the mother region is an inorganic compound, and
the first region is a substance obtained by firing a binder mixed in the inorganic compound for molding the inorganic compound prior to sintering the same.

13. The vapor phase epitaxial growth device according to claim 4, wherein
the solid unit is a ceramic sintered body or tungsten, tantalum, molybdenum, niobium, or an alloy thereof,
the mother region is an inorganic compound, and
the first region is a substance obtained by firing a binder mixed in the inorganic compound for molding the inorganic compound prior to sintering the same.

14. The vapor phase epitaxial growth device according to claim 5, wherein
the solid unit is a ceramic sintered body or tungsten, tantalum, molybdenum, niobium, or an alloy thereof,
the mother region is an inorganic compound, and
the first region is a substance obtained by firing a binder mixed in the inorganic compound for molding the inorganic compound prior to sintering the same.

15. The vapor phase epitaxial growth device according to claim 6, wherein
the solid unit is a ceramic sintered body or tungsten, tantalum, molybdenum, niobium, or an alloy thereof,
the mother region is an inorganic compound, and
the first region is a substance obtained by firing a binder mixed in the inorganic compound for molding the inorganic compound prior to sintering the same.

16. The vapor phase epitaxial growth device according to claim 7, wherein
the solid unit is a ceramic sintered body or tungsten, tantalum, molybdenum, niobium, or an alloy thereof,
the mother region is an inorganic compound, and
the first region is a substance obtained by firing a binder mixed in the inorganic compound for molding the inorganic compound prior to sintering the same.

* * * * *